(12) United States Patent  (10) Patent No.: US 8,202,800 B2
Chen et al.  (45) Date of Patent: Jun. 19, 2012

(54) METHOD OF FORMING THROUGH SILICON VIA WITH DUMMY STRUCTURE

(75) Inventors: Chih-Hua Chen, Jhubei (TW);
Chen-Shien Chen, Zhubei (TW);
Chen-Cheng Kuo, Chu-Pei (TW);
Wen-Wei Shen, Xinzhuang (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/112,347

(22) Filed: May 20, 2011

(65) Prior Publication Data

US 2011/0217841 A1 Sep. 8, 2011

Related U.S. Application Data

(62) Division of application No. 12/791,978, filed on Jun. 2, 2010, now Pat. No. 7,969,013.

(60) Provisional application No. 61/254,043, filed on Oct. 22, 2009.

(51) Int. Cl.
*H01L 21/44* (2006.01)
(52) U.S. Cl. ............... 438/667; 257/E21.597
(58) Field of Classification Search .................. 438/667; 257/E21.597
See application file for complete search history.

(56) References Cited

U.S. PATENT DOCUMENTS

| | | | |
|---|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,605,080 B2 | 10/2009 | Koizumi et al. |

*Primary Examiner* — Kiesha Bryant
*Assistant Examiner* — Marvin Payen
(74) *Attorney, Agent, or Firm* — Lowe Hauptman Ham & Berner, LLP

(57) ABSTRACT

A method of forming a through silicon via (TSV) structure includes forming an interconnect pad over a substrate. An under layer is formed over the interconnect pad. A vertical conductive post is formed at least partially through the substrate. At least one dummy structure is formed at least partially through the under layer. A top pad is formed over the dummy structure and the vertical conductive post. The top pad covers a wider area than a cross section of the vertical conductive post. The interconnect pad is electrically connected to the top pad. The dummy structure connects the top pad and the under layer thereby fastening the top pad and the interconnect pad.

20 Claims, 4 Drawing Sheets

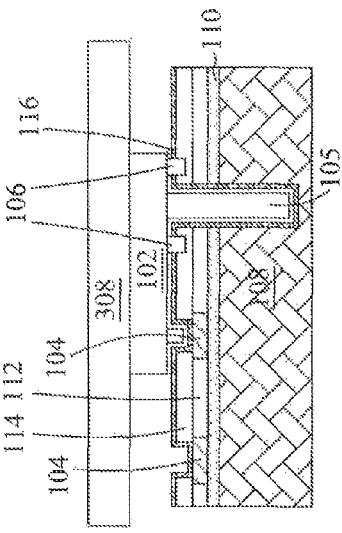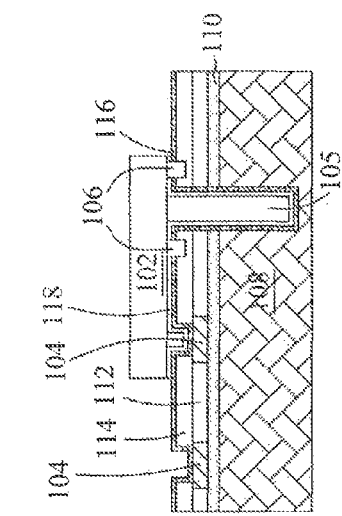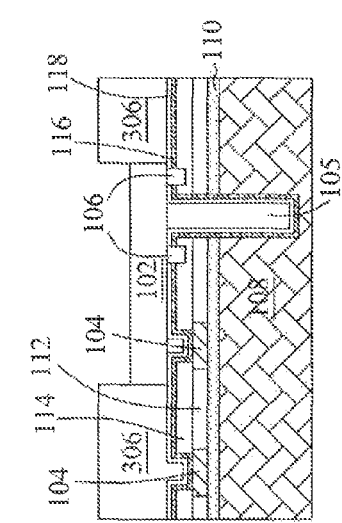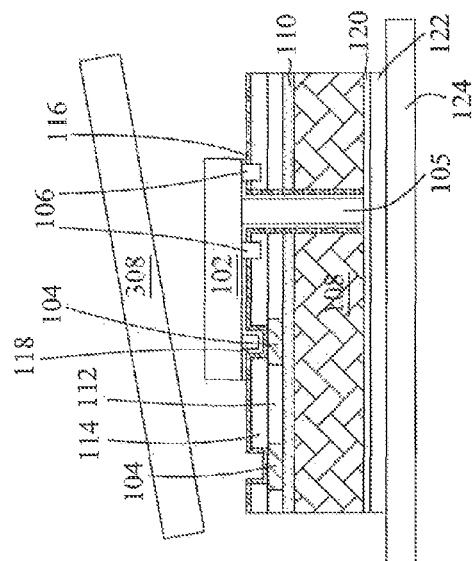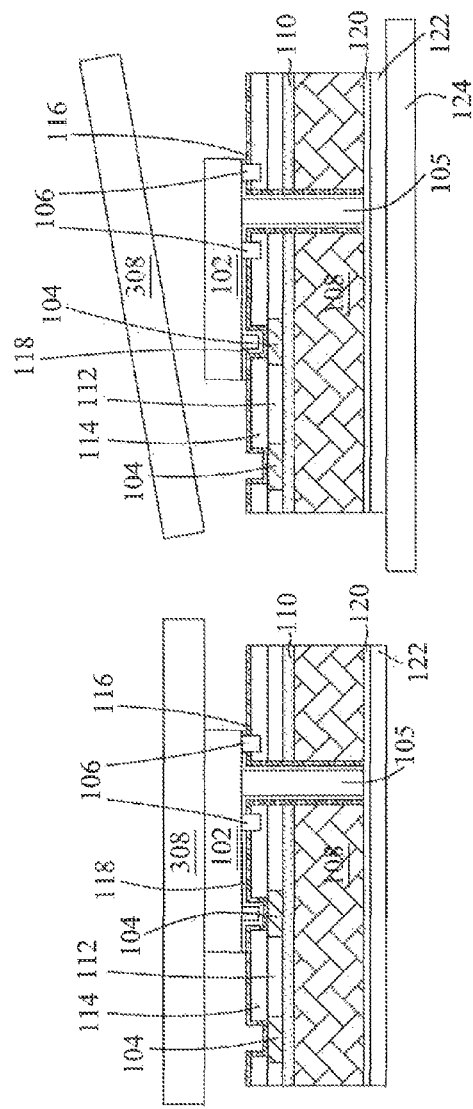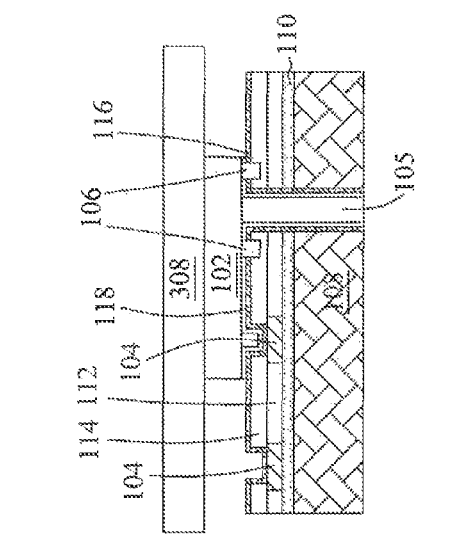

METHOD OF FORMING THROUGH SILICON VIA WITH DUMMY STRUCTURE

CROSS-REFERENCE TO RELATED APPLICATIONS

The present application is a divisional application of U.S. patent application Ser. No. 12/791,978, filed on Jun. 2, 2010, which claims priority of U.S. Provisional Patent Application Ser. No. 61/254,043, filed on Oct. 22, 2009, the entire disclosures of which are incorporated herein by reference.

TECHNICAL

The present disclosure relates generally to the field of semiconductor circuits, and more particularly, to a through-silicon-via (TSV) structure for integrated circuits.

BACKGROUND

A through-silicon via (TSV) is a vertical electrical connection passing through a silicon wafer or die. TSV technology is important in creating 3-dimensional (3D) packages and 3D integrated circuits. A 3D package, e.g. system in package, chip stack multi-chip module (MCM), etc., contains two or more chips (integrated circuits) stacked vertically so that they occupy less space.

In most 3D packages, the stacked chips are wired together along their edges; this edge wiring slightly increases the length and width of the package and usually requires an extra interposer layer between the chips. In some new 3D packages, through-silicon vias replace edge wiring by creating vertical connections through the body of the chips. The resulting package has no added length or width. Because no interposer is required, a TSV 3D package can also be flatter than an edge-wired 3D package.

A 3D integrated circuit is a single integrated circuit built by stacking silicon wafers and/or dies and interconnecting them vertically so that they are packaged as a single device. By using TSV technology, 3D ICs can pack a great deal of functionality into a small footprint. In addition, critical electrical paths through the device can be drastically shortened, leading to faster operation.

However, interface failure between TSV and interconnect pad is problematic. For example, copper TSV connected to an aluminum interconnect pad suffers high thermal stress because of temperature coefficient difference and the large thickness of copper. The failure location is typically at an interface between Cu and Al/AlCu. The cause of the failure is Cu delamination induced by Joule heating or higher temperature.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 3A-FIG. 3L are cross-sectional views of a through silicon via (TSV) structure including one or more dummy structure at various manufacturing stages.

DETAILED DESCRIPTION OF ILLUSTRATIVE EMBODIMENTS

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the invention.

Figure 1A:
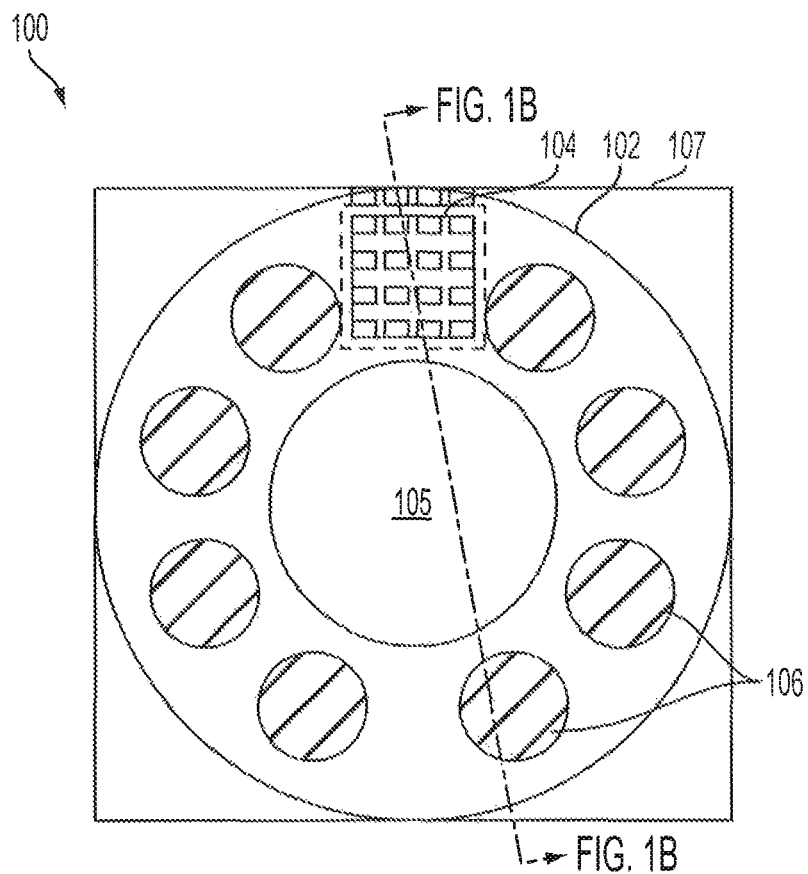
FIG. 1A-FIG. 1B are a top view and a cross-sectional view of a through silicon via (TSV) structure including one or more dummy structure according to some embodiments.
Figure 1B:
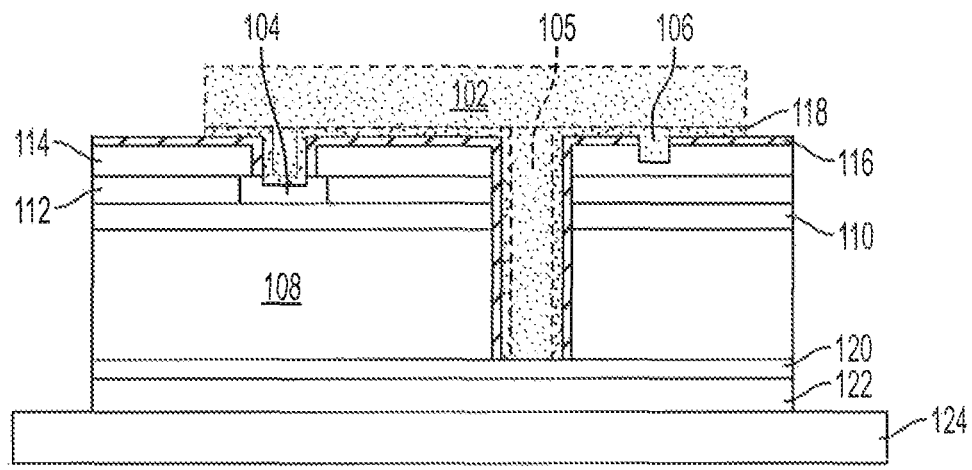

A structure of through silicon via (TSV) using one or more dummy structure to improve adhesion to the interconnect pad and a method to fabricate the same are provided. FIG. 1A-FIG. 1B are a top view and a cross-sectional view of a through silicon via (TSV) structure including one or more dummy structure according to some embodiments. FIG. 1A shows a top view of the TSV structure 100, including a top pad 102, an interconnect pad 104 and dummy structures 106. The through silicon via structure 100 further includes a vertical conductive post 105 that is connected to the top pad 102. The top pad 102 covers a wider area than the cross section of the vertical conductive post 105. An interconnect pad 104 is located at least partially below the top pad 102. An under layer 107 is also located at least partially below the top pad 102. At least one dummy structure 106 connects the top pad 102 and the under layer 107, fastening the top pad 102 and the interconnect pad 104. The dummy structures 106 are distributed circularly around the vertical conductive post 105 in one embodiment.

FIG. 1B shows a cross section view of the TSV structure 100 along the cross section line 1B according to one embodiment. The top pad 102 is connected to the vertical conductive post 105 to form a TSV. The interconnect pad 104 is also shown under the top pad 102. The dummy structure 106 connects the top pad 102 and the under layer 107 (in FIG. 1A). Depending on implementations, in some embodiments, the under layer 107 can include a seed layer 118, an isolation layer 116, the second passivation layer 114, any other suitable layer (e.g. dummy interconnect layer), or any combinations thereof.

The vertical conductive post 105 is connected to a backside interconnect layer 120 through a substrate 108. The backside interconnect layer 120 is shown on top of an electroless nickel/immersion gold (ENIG) layer 122 and the dicing tape 124. On the substrate 108, the first passivation layer 110, the second passivation layers 112 and 114 are also shown.

The dummy structures 106 fasten the top pad 102 and interconnect pad 104 to improve the reliability and interconnection performance. The dummy structures 106 increase the thermal tolerance of the structure and improve the adhesion between the top pad 102 and the interconnect pad 104. The top pad 102 and the vertical conductive post 105 can comprise copper, tungsten, or any other suitable material. The top pad 102 can have a diameter about 15 µm-about 50 µm in some embodiments. The interconnect pad 104 can comprise Al, AlCu, Cu, or any other suitable material. The interconnect pad 104 can have a length/width about 5 µm-about 60 µm. The vertical conductive post 105 can have a depth about 50 µm-about 200 µm in some embodiments. The TSV structure 100 may have different geometries and dimensions for enhanced performance in various embodiments.

The dummy structures 106 can also comprise copper, tungsten, or any other suitable material. The dummy structures 106 can have a diameter about 0.5 µm-about 10 µm and a depth about 0.5 µm-about 2 µm in some embodiments. The area ratio between the dummy structure 106 and the top pad 102 can be about 5%-about 40% in some embodiments. The interconnect pad 104 can have a length or a width about 5 μm-about 60 μm in some embodiments. The isolation layer 116 can comprise dielectric material, and have a thickness of about 0.5 μm-about 2 μm in some embodiments.

Figure 2A:
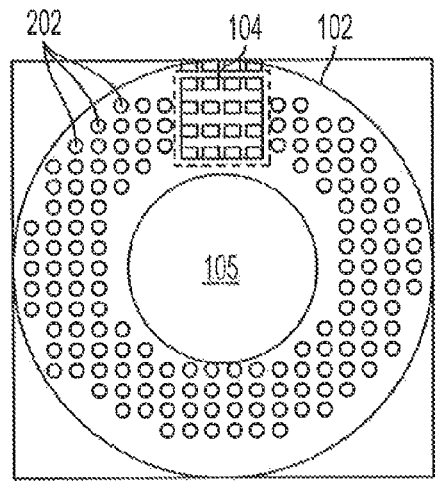
FIG. 2A-FIG. 2C are top views of a through silicon via (TSV) structure including one or more dummy structure according to some embodiments.
Figure 2B:
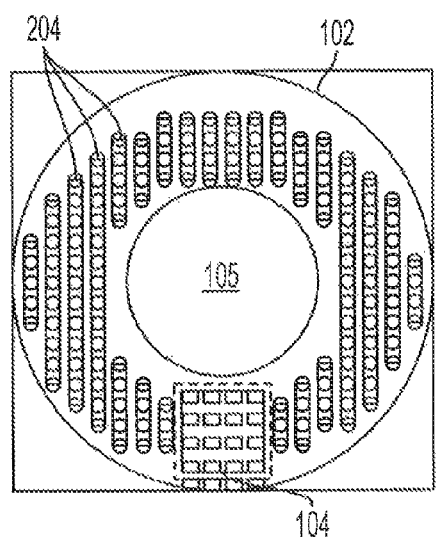
Figure 2C:
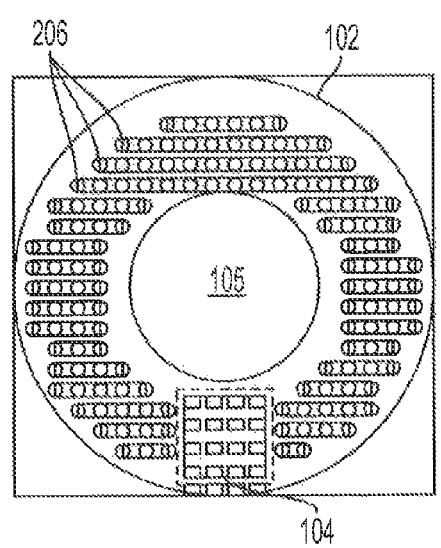

FIG. 2A-FIG. 2C are top views of a through silicon via (TSV) structure including one or more dummy structure according to some embodiments. In FIG. 2A, dummy structures 202 have, for example, a circular shape, and they are distributed around the vertical conductive post 105. The dummy structures 202 can be distributed uniformly under the top pad 102 except an area where the top pad 102 is connected to the vertical conductive post 105. The dummy structures 202 can be distributed in a square grid pattern. In FIG. 2B, the dummy structures 204 have a linear shape. The linear shape can be a straight line. The dummy structures 204 can be evenly spaced from each other. The dummy structures 204 can have at least two different lengths. In FIG. 2C, the dummy structures 206 also have a linear shape and aligned in a different direction compared to FIG. 2B.

FIG. 3A-FIG. 3L are cross-sectional views of a through silicon via (TSV) structure including one or more dummy structure at various manufacturing stages. In general, the process includes TSV etching to provide space for TSV, TSV isolation to prevent undesired contact, creating openings for TSV connection with interconnect pad, and TSV plating (e.g., Cu).

Figure 3A:
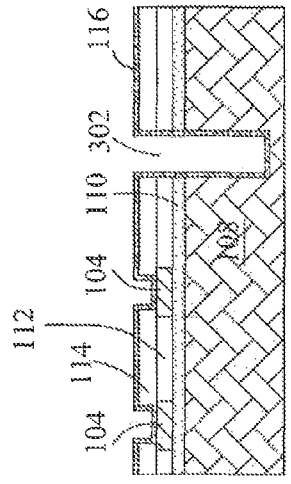

Referring to FIG. 3A, a substrate 108 is shown. In one example, the substrate 108 is a semiconductor wafer. In another example, the substrate 108 includes a semiconductor chip. In at least one embodiment, the substrate 108 includes silicon. In some other embodiments, the substrate 108 may alternatively or additionally include other elementary semiconductor, such as germanium. The substrate 108 may also include a compound semiconductor, such as silicon carbide, gallium arsenic, indium arsenide, and indium phosphide.

The substrate 108 may include an epitaxial layer. For example, the substrate 108 may have an epitaxial layer overlying a bulk semiconductor. Further, the substrate 108 may be strained for performance enhancement. For example, the epitaxial layer may include semiconductor materials different from those of the bulk semiconductor such as a layer of silicon germanium overlying bulk silicon, or a layer of silicon overlying a bulk silicon germanium formed by a process including selective epitaxial growth (SEG). Furthermore, the substrate 108 may include a semiconductor-on-insulator (SOI) structure. In various examples, the substrate 108 includes a buried oxide (BOX) layer formed by a process such as separation by implanted oxygen (SIMOX).

In some embodiments, the substrate 108 can include various doped wells and other doped features configured and coupled to form various microelectronic devices such as metal-insulator-semiconductor field effect transistor (MOSFET) including complementary MOSFET (CMOS), imaging sensor including CMOS imaging sensor (CIS), micro-electro-mechanical system (MEMS), and/or other suitable active and/or passive devices. The doped wells and other doped features include p-type doped region and/or an n-type doped region, formed by a doping process such as ion implantation.

Other structures such as gate dielectric and polysilicon gate electrodes may be additionally formed on the substrate 108 for devices such as MOSFET devices. The substrate 108 also includes various isolation features configured to separate various devices from each other for proper isolation. The isolation features may include different structures and can be formed by certain particular processing technologies. In one example, the isolation features include dielectric isolation such as shallow trench isolation (STI). The STI can be fabricated by etching the substrate to form a trench and filling the trench with a dielectric material.

Also, an interconnect structure can formed on the substrate 108 and configured to properly connect various doped regions in the substrate, resulting in the integrated circuit with designed functions. The interconnect structure can include multilayer interconnect (MLI) having horizontal conductive features (metal lines) disposed at multiple metal layers and vertical conductive features, such as contacts and vias. A via is configured to connect two metal lines at different metal layers. A contact is configured to connect a metal line and the substrate 108. The multi layer interconnect may include conductive materials such as aluminum, aluminum/silicon/copper alloy, titanium, titanium nitride, tungsten, polysilicon, metal silicide, or combinations thereof.

Aluminum interconnect can be formed by a process including physical vapor deposition (PVD such as PVD by sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). In some embodiments, still other manufacturing processes such as thermal annealing may be used to form metal silicide to reduce contact resistance.

In some alternative embodiments, a copper or other interconnect may be used. Copper or other interconnect may include copper, copper alloy, titanium, titanium nitride, tantalum, tantalum nitride, tungsten, polysilicon, metal silicide, or combinations thereof. The copper or other interconnect may be formed by a technique such as CVD, sputtering, plating, and/or other suitable processes. The metal silicide used in multilayer interconnects may include nickel silicide, cobalt silicide, tungsten silicide, tantalum silicide, titanium silicide, platinum silicide, erbium silicide, palladium silicide, or combinations thereof.

In addition, dielectric material features can be disposed on the substrate 108 to isolate various conductive elements. The dielectric material features include an interlayer dielectric (ILD) disposed between the substrate and the first metal layer. The dielectric material features also include inter-metal dielectric (IMD) disposed between adjacent metal layers. The dielectric material features include a dielectric material such as silicon oxide, silicon nitride, silicon oxynitride, or spin-on glass (SOG). The dielectric material, in some alternative embodiments, includes a material of a low dielectric constant (low k) such as a dielectric constant less than about 3.5. In various examples, the dielectric material may include silicon dioxide, silicon nitride, silicon oxynitride, spin-on glass (SOG), fluoride-doped silicate glass (FSG), carbon doped silicon oxide, BLACK DIAMOND® (Applied Materials of Santa Clara, Calif.), Xerogel, Aerogel, amorphous fluorinated carbon, Parylene, BCC (bis-benzocyclobutenes), SILK (Dow Chemical, Midland, Mich.), polyimide, and/or other suitable materials. The dielectric material features can be formed by a technique including spin-on coating, CVD, or other suitable processes.

In FIG. 3A, a first passivation layer 110 is formed on the substrate 108 and second passivation layers 112 and 114 are formed on the first passivation layer 110. The first and second passivation layers each may include various passivation materials. In one embodiment, the first passivation layer 110 includes silicon oxide. In one example, the silicon oxide passivation layer may have a thickness ranging between about 0.2 μm and about 2 μm, in another example, the silicon oxide passivation layer may be formed by a high density plasma CVD process. In another embodiment, the second passivation layers 112 and 114 comprise silicon nitride and/or silicon oxynitride. In one example, the second passivation layers 112 and 114 may have a thickness ranging between about 2 μm and about 6 μm. In one example, a silicon nitride passivation layer is formed by a plasma enhanced CVD (MOM) process. The precursors used to form silicon nitride in CVD include Hexachlorodisilane ($Si_2Cl_6$), Dichlorosilane ($SiH_2Cl_2$), Bis (TertiaryButylAmino)Silane ($C_8H_{22}N_2Si$), and/or Disilane ($Si_2H_6$).

The interconnect pads 104 are also formed over the substrate 108. The interconnect pads 104 can have a thickness about 1 μm-about 4 μm in some embodiments. The interconnect pads 104 are disposed on the first passivation layer 110 and positioned at least partially within the openings of the second passivation layers 112 and 114. In one example, the interconnect pads 104 include aluminum. In one embodiment of the interconnect pad formation, an aluminum layer is deposited on the first passivation layer 110 and within the openings of the second passivation layers 112 and 114 to connect to interconnect structures. The aluminum layer is then patterned to form the various interconnect pads 104. The second passivation layer 112 and 114 are deposited on the first passivation layer 110. The second passivation layer 114 deposited on the interconnect pads 104 is then patterned to expose the interconnect pads 104.

Interconnect pads 104 can include conductive materials such as aluminum, aluminum/silicon/copper alloy, titanium, titanium nitride, tungsten, polysilicon, metal silicide, or combinations thereof. Aluminum interconnect pads can be formed by a process including physical vapor deposition (PVD such as PVD by sputtering), chemical vapor deposition (CVD), or combinations thereof. Other manufacturing techniques to form the aluminum interconnect pad may include photolithography processing and etching to pattern the conductive materials for vertical (via and contact) and horizontal connects (conductive line). Still other manufacturing processes such as thermal annealing may be used to form metal silicide to reduce contact resistance. In some alternative embodiments, a copper or other interconnect pad may be used. Copper or other interconnect pad may include copper, copper alloy, titanium, titanium nitride, tantalum, tantalum nitride, tungsten, polysilicon, metal silicide, or combinations. The copper or other interconnect may be formed by a technique such as CVD, sputtering, plating, or other suitable processes. The metal suicide used in multilayer interconnects may include nickel silicide, cobalt suicide, tungsten silicide, tantalum silicide, titanium silicide, platinum silicide, erbium silicide, palladium silicide, or combinations thereof.

In FIG. 3A, TSV etching such as a dry plasma etching process is performed to form the TSV opening 302 through the first passivation layer 110, the second passivation layers 112 and 114. Plasma etch can be performed in several modes by adjusting the parameters of the plasma. Ordinary plasma etching operates between 0.1 and 5 torr. The plasma produces energetic free radicals, neutrally charged, that react at the surface of the wafer. Since neutral particles attack the wafer from all angles, this process is isotropic. The source gas for the plasma usually contains small molecules rich in chlorine or fluorine. For instance, in some embodiments, carbon tetrachloride (CCl4) can be used to etch silicon and aluminum, and trifluoromethane can be used to etch silicon dioxide and silicon nitride.

Figure 3B:
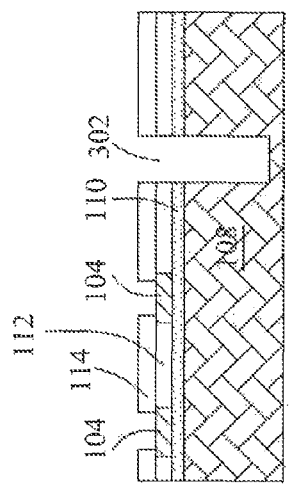

In FIG. 3B, additional TSV etching such as a dry plasma etching process is performed to form a deeper TSV opening 302 partially through the substrate 108. In some embodiments, the TSV opening 302 does not extend all the way through the substrate 108, but the rest of the substrate 108 can be removed later. For example, backside polishing at a later stage can be performed.

Figure 3C:
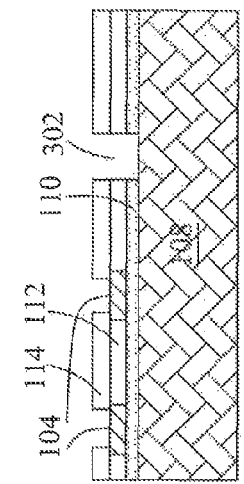

In FIG. 3C, the isolation layer 116 is deposited over the interconnect pads 104 and the second passivation layer 114. The isolation layer 116 may comprise silicon oxide layer, tetraethoxysilane (TEOS), silica glass, or any other suitable material. The isolation layer 116 may have a thickness about 0.5 μm-about 2 μm in one embodiment.

Figure 3D:
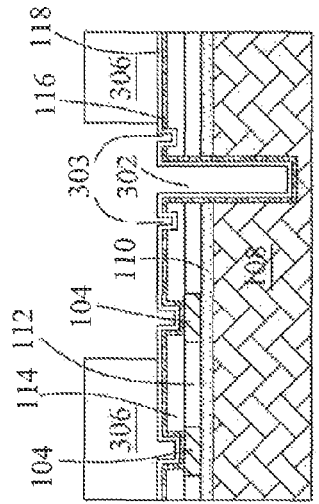

In FIG. 3D, photo resist (PR) layer 304 can be deposited by spray coating or spin coating, and then openings 303 for dummy structures are etched out. In one embodiment, the thickness of PR layer 304 can be about 1 μm-about 5 μm. In one example, spin coating is used to form thin films with uniform thickness over flat substrates. An excess amount of a solution is placed on the substrate, which is then rotated at high speed in order to spread the fluid by centrifugal force. Rotation is continued while the fluid spins off the edges of the substrate, until the desired thickness of the film is achieved. Photoresist is typically spun at 20 to 80 revolutions per second for 30 to 60 seconds.

Figure 3E:
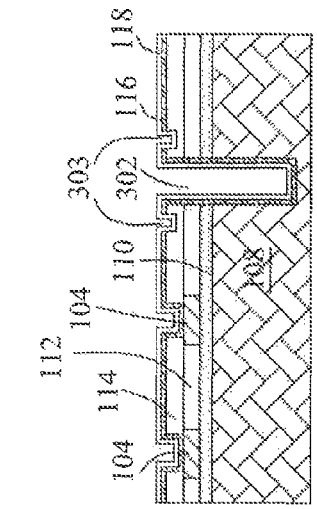

In FIG. 3E, PR layer 304 is removed and seed layer 118 is deposited. The seed layer 118 can comprise Cu, Ti, TiN, W, any other suitable material, or any combinations thereof in some embodiments. In one example, a copper seed layer can be formed by physical vapor deposition (PVD) such as PVD by sputtering. In one embodiment, the seed layer 118 can have a thickness ranging between about 10 nm and about 600 nm.

Figure 3F:
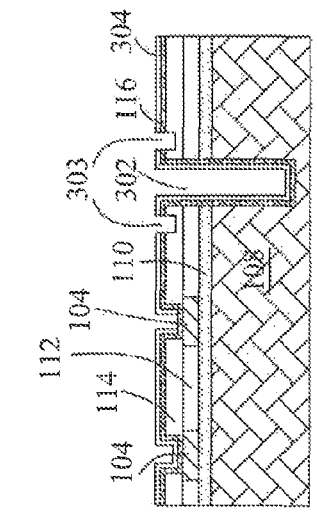

In FIG. 3F, another PR layer 306 is formed. The PR layer 306 can be either liquid PR or dry film PR. The PR layer 306 prevents metal deposit in undesired areas in the next stage.

In FIG. 3G, a TSV including top pad 102 and vertical conductive post 105 is formed as well as dummy structures 106 over the seed layer 118 by a suitable method such as plating a metal layer (e.g. copper, tungsten, any other suitable material). Other process may be further followed. For example, a chemical mechanic polishing (CMP) process may be applied thereafter to planarize the surface. The metal layer may be further patterned to form the TSV. For example, if a copper layer is implemented, then a damascene process can be used to form patterned copper features including TSV. In one embodiment, the top pad 102 of the TSV is connected to one of the interconnect pads 104. In some embodiments, wafers and/or chips can be stacked vertically and coupled through TSV features. Such TSV 3D package creates vertical connections through chip body and eliminates additional wire. The top pad 102 may have a diameter about 15 μm-50 μm and the vertical conductive post 105 may have a depth about 50 μm-200 μm in embodiments. The top pad 102 and the vertical conductive post 105 of the TSV may have different geometries and dimensions for enhanced performance in various embodiments.

In FIG. 3H, the PR film 306 is removed and seed layer 118 outside the top pad 102 area is etched out. In one embodiment, a liquid resist stripper can be used, which chemically alters the resist so that it no longer adheres to the layer below. In some alternative embodiments, photoresist may be removed by ashing, i.e. a plasma containing oxygen that oxidizes the photoresist.

In FIG. 3I, a carrier 308 is placed over the substrate 108 so that the backside processing of the substrate 108 can be performed.

In FIG. 3J, the backside of the substrate 108 is ground and polished. The backside polishing process thins the substrate 108 and exposes the vertical conductive post 105 of the TSV from the backside of the substrate 108 for 3-D packaging. For example, the TSV can be coupled to other wafer/chip in embodiments.

In FIG. 3K, interconnect layer 120 and electroless nickel/immersion gold (ENIG) layer 122 can be formed. In one example, aluminum sputtering can be performed to form the interconnect layer 120 with a thickness of about 1 µm to about 5 µm. The ENIG layer 122 can have a thickness of about 100 nm-about 4 µm.

In FIG. 3L, the carrier 308 is debonded and dicing tape 124 is put on under the substrate 108. In one example, the dicing tape 124 can comprise a polymer tape. The dicing tape 124 has a sticky backing that holds the wafer on a thin sheet metal frame. Once a wafer has been diced, the remaining components that are left on the dicing tape 124 are referred to as die, dice or dies. The die will stay on the dicing tape 124 until they are extracted by die handling equipment, like a die bonder or die sorter, further in the electronics assembly process.

The TSV structure 100 disclosed herein can improve its temperature tolerance. For example, a conventional structure contact resistance shifted significantly within one day under one stress test. In comparison, the TSV structure 100 using one or more dummy structure 106 as described above can keep the same performance more than 2000 hrs under the same stress test. A skilled person in the art will appreciate that there can be many embodiment variations of this invention.

Although exemplary embodiments of the present invention and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure herein, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a through silicon via (TSV) structure, said method comprising:
forming an interconnect pad over a substrate;
forming an under layer over the interconnect pad;
forming a vertical conductive post at least partially through the substrate;
forming at least one dummy structure at least partially through the under layer; and
forming a top pad over the dummy structure and the vertical conductive post, wherein the top pad covers a wider area than a cross section of the vertical conductive post, the interconnect pad is electrically connected to the top pad, and the dummy structure connects the top pad and the under layer thereby fastening the top pad and the interconnect pad.

2. The method of claim 1, further comprising etching the under layer to form space for the dummy structure.

3. The method of claim 1, wherein forming the under layer comprises forming a seed layer.

4. The method of claim 1, wherein forming the under layer comprises forming an isolation layer.

5. The method of claim 1, wherein forming the under layer comprises forming a passivation layer.

6. The method of claim 1, wherein forming the under layer comprises forming a dummy interconnect layer.

7. The method of claim 1, further comprising polishing a backside of the substrate to expose the vertical conductive post on the backside.

8. The method of claim 1, further comprising forming a backside interconnect layer below the substrate, wherein the backside interconnect layer is connected to the vertical conductive post.

9. The method of claim 8, further comprising forming an electroless nickel immersion gold (ENIG) layer below the backside interconnect layer.

10. A method of forming a through silicon via (TSV) structure, said method comprising:
forming an interconnect pad over a substrate;
forming an under layer over the interconnect pad, the under layer including an isolation layer;
forming a vertical conductive post at least partially through the substrate;
forming at least one dummy structure at least partially through the under layer;
forming a top pad over the dummy structure and the vertical conductive post, wherein the top pad covers a wider area than a cross section of the vertical conductive post, the interconnect pad is connected to the top pad, and the dummy structure connects the top pad and the under layer thereby fastening the top pad and the interconnect pad; and
polishing a backside of the substrate to expose the vertical conductive post on the backside.

11. The method of claim 10, further comprising forming a backside interconnect layer below the substrate, wherein the backside interconnect layer is connected to the vertical conductive post.

12. The method of claim 10, wherein the formation of the at least one dummy structure comprising forming a plurality of the dummy structures around the vertical conductive post.

13. The method of claim 12, wherein the dummy structures are formed with a uniform distribution in a first area underneath the top pad except a second area occupied by either the vertical conductive post or a connection structure that connects the top pad and the interconnect pad.

14. The method of claim 12, wherein the dummy structures are formed in a square grid pattern.

15. The method of claim 12, wherein the dummy structures are formed in a circular pattern around the vertical conductive post.

16. The method of claim 12, comprising forming a plurality of said dummy structures having a linear shape placed around the vertical conductive post.

17. The method of claim 16, wherein the dummy structures are formed as straight lines.

18. The method of claim 16, wherein the dummy structures are formed to be evenly spaced from each other.

19. The method of claim 16, wherein the dummy structures are formed to have at least two different lengths.

20. A method of forming a through silicon via (TSV) structure, said method comprising;
forming an interconnect pad over a substrate;
forming an under layer over the interconnect pad, the under layer including an isolation layer;
forming a vertical conductive post at least partially through the substrate;
etching the under layer to form space for at least one dummy structure;

forming the at least one dummy structure at least partially through the under layer;

forming a top pad over the dummy structure and the vertical conductive post, wherein the top pad covers a wider area than a cross section of the vertical conductive post, the interconnect pad is connected to the top pad, and the dummy structure connects the top pad and the under layer thereby fastening the top pad and the interconnect pad;

polishing a backside of the substrate to expose the vertical conductive post on the backside; and forming a backside interconnect layer below the substrate, the backside interconnect layer being connected to the vertical conductive post.

* * * * *